United States Patent [19]

Blakely

[11] Patent Number: 4,827,228

[45] Date of Patent: May 2, 1989

[54] IN-LINE FILTERING DEVICE FOR A TELECOMMUNICATIONS LINE

[75] Inventor: Roy D. Blakely, Montreal, Canada

[73] Assignee: Northern Telecom Limited, Montreal, Canada

[21] Appl. No.: 930,170

[22] Filed: Nov. 13, 1986

[51] Int. Cl.[4] .................. H03H 7/01

[52] U.S. Cl. .................. 333/167; 333/12; 333/182; 333/185

[58] Field of Search .................. 333/167, 181–185, 333/12; 339/99 R, 95 R, 96; 29/857; 439/387, 389–391, 393–408

[56] References Cited

U.S. PATENT DOCUMENTS 4,253,722 3/1981 Fox, Jr. .................. 29/857

4,563,660 1/1986 McNeilly .................. 333/12 X

*Primary Examiner*—Marvin L. Nussbaum
*Attorney, Agent, or Firm*—R. J. Austin

[57] ABSTRACT

An in-line filtering device for a telecommunications line having an insulation displacement connection member located within a channel formed in a dielectric housing. The connection member is devoid of a wire terminal. A ground line is connected to the connector member, the ground line including a radio frequency filter. The channel is open-ended at both ends to allow an insulated conductor wire to pass, without a break in the wire, completely along the channel and out from both ends with the conductor wire electrically connected to the insulation displacement connection member.

24 Claims, 4 Drawing Sheets

IN-LINE FILTERING DEVICE FOR A TELECOMMUNICATIONS LINE

This invention relates to in-line filtering devices for telecommunications lines.

In the telecommunications field, telecommunications lines pass through equipment, for instance in the central office. As such equipment becomes more complex and operational frequency ranges are increased, it has been found that radio frequencies which are generated interfere with signals emitted by other equipment.

To prevent such frequencies from being emitted by the telecommunications equipment, it is known to provide frequency range filters in the equipment and also in the telecommunications lines which extend from it. Such filters when fitted to the central office equipment itself are effected by providing a ground line to the equipment, the ground line including a radio frequency filter. Separate filters provided for the telecommunications lines themselves are effected by providing a break in each one and connecting the two conductor wires to two ends at the break into terminals of two connectors. One of these connectors may be provided with a filter for the line in which case the two connectors may be coupled directly together. Alternatively, the two connectors are coupled directly into an adaptor which is provided with the filter. In either case, the filter is included in a ground line connected to a line terminal or terminal pin whereby any undesirable frequencies in the line become grounded. It is normal for one of the connectors or the adaptor to be mounted upon a grounding bulkhead of the central office equipment.

Problems with the conventional methods of filtering telecommunications lines include the necessity for providing a break in each line and the necessity of having to connect the connectors and the adaptor together in situ. The breaks in each line required that wire codes be followed so that proper connection between ends of the same wire be made. The provision of filters for telecommunication lines is inordinately costly with the cost being attributable to the numbers and types of connections and adaptors required and the time and labor spent in assembling the connectors and the adaptors and securing them to the bulkhead.

The present invention provides a telecommunications in-line filtering device which, in use, allows the above problems to be avoided or minimized.

Accordingly, the present invention provides an in-line filtering device for a telecommunications line comprising a housing of dielectric material, the housing defining a channel with two open ends for passage of an insulated conductor wire along the passage and out through the open ends, the device also comprising an insulation displacement connector member for serving insulation and electrically contacting a conductor wire of the telecommunications line, the insulation displacement connector member disposed within the channel which is devoid of a wire terminal, and a ground line connected to the connector member, the ground line including within it a radio frequency filter.

In use, the telecommunications line may be connected into the filtering device of the invention by inserting an unbroken conductor wire laterally into the insulation displacement connector member so that electrical connection is made with the member and without causing a break in the conductor wire. Thus, the filtering device is a single module which is cheaper to produce than the plurality of connectors and filter adaptor required for conventional filtering arrangements. In addition, the unbroken conductor wire may be quickly and easily inserted into the inventive filtering device by factory techniques whereby the finished assembly of filtering device and insulated conductor wire need only to be attached to a suitable support to be in a position for use. In addition to this, the use of an insulation displacement connector member allows for a relatively quick connection to be made with the insulated conductor wire and such connections are easily made in the field should such a course be necessary.

The filtering device of the invention may be used comfortably with strain relief devices for holding the insulated conductor wire and which are separate from the device. However, in a preferred arrangement, the filtering device is provided with its own strain relief means. Conveniently this strain relief means is in the form of two strain relief elements which are located one on each side of the insulation displacement connector member to grip the conductor insulation as it extends in both directions from that member.

The filtering device of the invention may only have a single insulation displacement connector member and its ground line for connection into a single telecommunciations line. However in a practical construction, there are a plurality of insulation displacement connector members provided and these members are dielectrically insulated from one another by the housing. It is extremely convenient in this arrangement to provide each insulation displacement connector member with its individual ground line and with the ground lines joined to a common ground bar. Each ground line may comprise two ground elements the first of which extends from its associated insulation displacement connector member and the second of said ground elements extends from the ground bar with the filter for the line lying in series between the two ground elements. In this arrangement, it is extremely convenient to form the common ground bar and the second ground elements integrally and from a single metal member with the second ground elements projecting in an in-parallel relationship to one another from the ground bar.

In a preferred practical arrangement, the housing has two sides at least one of which is formed with channels having lateral openings to the side surface and the channels are separated by ribs of the housing. An insulation displacement connector member is held within each channel for lateral reception of an insulated conductor through the opening. The strain relief elements, where these are included in the device, may also be located within the channels. In this case, the associated ground lines should also extend along the channels.

The invention further includes an assembly of an insulated telecommunications conductor wire and an in-line filtering device for a telecommunications line comprising a housing of dielectric material, the housing defining a channel with two open ends for passage of an insulated conductor wire along the passage and out through the open ends, the device also comprising an insulation displacement connector member for severing insulation and electrically contacting a conductor wire of the telecommunications line, the insulation displacement member disposed within the channel which is devoid of a wire terminal, and a ground line connected to the connector member, the ground line including a radio frequency filter, and the insulated conductor wire being held by the insulation displacement connector member with the member extending through the insulation and electrically contacting the conductor wire and with the conductor wire extending unbroken into the housing, through the insulation displacement connector member and out from the housing.

One embodiment of the invention will now be described, by way of example, with reference to the accompanying drawings, in which.

Figure 1:
FIG. 1 PRIOR ART
FIGS. 1 and 2 are diagrammatic side elevational representations of a prior art filtering arrangement for a telecommunications line.

In one form of prior art filtering arrangement as shown in FIG. 1, a telecommunications line is broken in that it comprises two cables 10 and 12 and the ends of the conductor wires 13 at the break in the line are joined to two mateable connectors 14 and 16. Only three wires 13 are shown for clarity. As may be seen, this procedure involves the use of the two connectors and two connections of conductor wires to the connectors for each line. The cost and time taken to assemble the connector lines to the filtering arrangement is influenced by the number and complexity of connectors, the number of terminations that need to be made for the conductor wires into the connectors. The cost and time is also influenced by the assembly of the connectors together and by their connection to a grounding support such as a bulkhead upon central office equipment. In addition, wire codes need to be strictly followed so that proper connection between the ends of the same are made.

Figure 2:
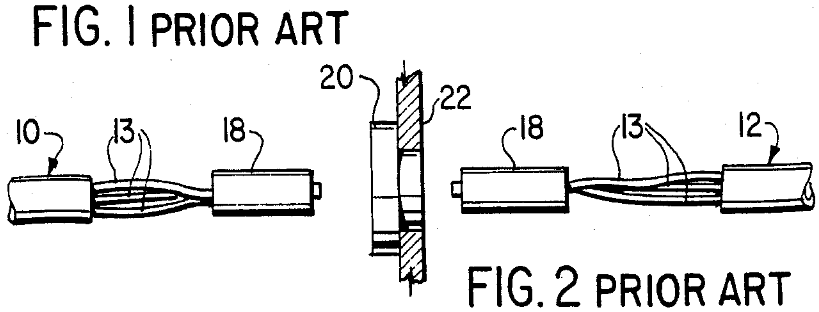
FIG. 2 PRIOR ART

In an alternative prior art filtering arrangement as shown in FIG. 2, two similar connectors 18 are joined to the conductor wire ends and need to be connected to a filter adaptor 20 which is mountable upon a grounding bulkhead 22. The cost and time required to assemble such an arrangement together is increased beyond that shown in FIG. 1 because of the user of the adaptor 20.

Figure 3:
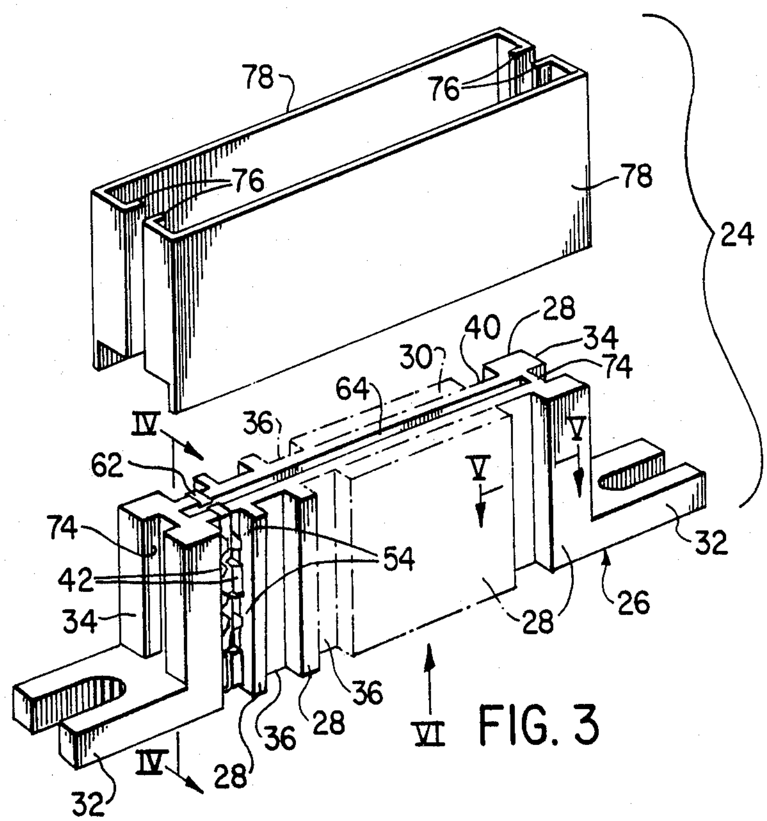
FIG. 3 is an exploded isometric view of an in-line filtering device according to the invention.

As shown by the embodiment of the invention in FIG. 3 onwards, the above disadvantages are reduced or avoided by the use of a single in-line filtering device 24.

The filtering device 24 comprises a parallel sided modular block housing 26 formed from a dielectric material such as a phenolic thermoplastics material. The housing 26 has two sides 28 and end surfaces 30 extending between the sides. At one end surface 30 is provided a means for holding the device to a rigid support. This mounting means comprises two open lugs 32 which extend outwardly beyond edge surfaces 34 of the housing.

The housing is provided on each side 28 with a plurality of channels 36 which are separated by ribs 38. As may be seen, the channels 36 are of rectangular cross-section, have lateral openings onto the surfaces of sides 28 and extend from end-to-end of the housing so as to open at the end surfaces 30. The channels are thus provided in two banks, one on each side 28 and the two banks are separated by a web 40 of the housing.

As is more clearly shown in FIGS. 4 and 7, each of the channels 36 houses an insulation displacement connector member 42 (referred to hereinafter as "IDC member"). Only one IDC member is shown in FIG. 3, because of smallness of detail. Each insulation displacement connector member 42 is of conventional construction for an insulation displacement connection part of an insulation displacement connection terminal and comprises base 44 located in the base of its associated channel, two upstanding and opposing sides 46 extending upwardly from opposite side edges of the base and an insulation displacement cutting means at each end of the insulation displacement connector member. As may be seen more clearly from FIG. 5, each cutting means comprises two flanges 50 extending inwardly, one from each of the sides 46 and these flanges are provided with cutting edges 52 which converge towards wire contacting edges 48 and the base 44. When an insulated conductor wire is inserted downwardly into the insulation displacement connector member, by insertion laterally through the opening of the channel, then the cutting edges 52 cut through the insulation thereby enabling the edges 48 to electrically contact the conductor wire which is forced between them and towards the base.

A strain relief means is also provided for each channel. Each strain relief means comprises a strain relief element 54 at each side of the IDC member along the channel. This is clearly shown in FIGS. 4 and 7. Each strain relief element comprises two bendable metal tags 56 of conventional construction, the tags being upstanding from a base 58 located in the base of the associated channel.

Figure 6:
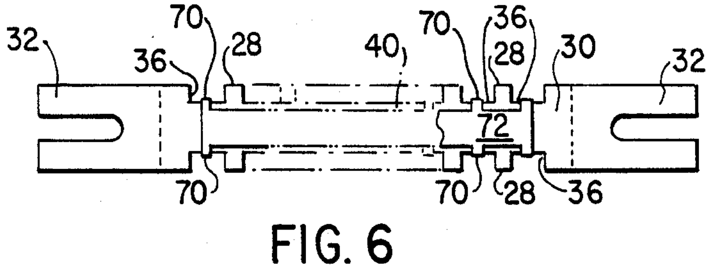
FIG. 6 is an end view in the direction of arrow V in FIG. 3.

Each IDC member has its own individual ground line which is connected to an extension 60 formed integrally with the strain relief elements and with the IDC member from a single piece of stamped electrically conductive metal the extension 60 exteding along the base of the channel from the IDC member. The extension 60 and the bases 44 and 58 of the IDC member and the strain relief elements extend from one to another. The single metal stamping is formed at one end with a further extension 62 which is bent as shown in FIGS. 4 and 7 to extend around one end surface 30 of the housing so as to become located down the side of an end surface groove 64. The remote end of the extenson 60 is also bent to pass downwardly into a recess 66 in the base of the channel (FIGS. 4 and 7), and this recess accommodates a radio frequency filter 68 in the form of a chip capacitor. This chip capacitor is electrically connected at one side to the extension 60 and at the other side to a ground line 70. The ground line 70 is suitably shaped to follow the side and base of the recess 66 and then continues along its channel before turning substantially at a right angle around the other end surface 30 at which position it extends into a common ground bar 72 for all of the ground lines. As shown in FIGS. 4, 6 and 7, the ground bar 72 extends along the end surface 30 and all of the ground lines 70 extend in in-parallel relationship to one another from the sides of the bar as they pass across the end surface and along the associated channels 36. The ground bar and the ground lines 70 are integral and are provided by a single metal member.

Figure 8:
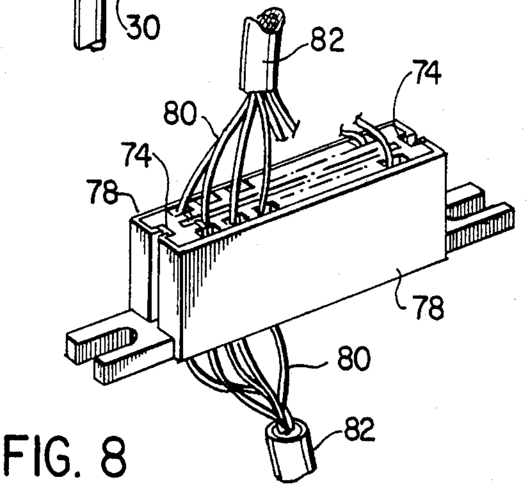
FIG. 8 is a view in the same direction as FIG. 3 with the device assembled.

As shown in FIGS. 3 and 8, each side surface 34 is formed with a longitudinally extending groove 74 for the sliding reception of turned-in edges 76 of two covers 78 as they are slid onto the housing 26 so as to cover the lateral openings of the channels. In the assembled condition, as shown in FIG. 8, the turned-in edges 76 of the covers lie side-by-side in the channels.

In use, insulated electrical conductors 80 of a cable 82 (FIGS. 7 and 8) are easily connected to the device without the necessity of severing the conductor wires themselves. This is easily accomplished by inserting each of the insulated conductors through the lateral openings of the channels 36, with the covers removed, so that the insulated conductor passes into an associated IDC member which operates in the normal fashion for an insulation displacement connector of an insulation displacement connector terminal to cut through the insulation and electrically contact the conductor wire with the edges 48 of the flanges 50. In this condition, as shown in FIG. 7, the insulated conductor wires extend from both ends of the channels with the wires themselves extending into the housing, through the insulation displacement connector member, and out of the housing in an unbroken fashion. Hence for every conductor wire, the assembly operation is quick and easy and involves a simple connection into an IDC member as distinct from making two connections into terminals of two separate connectors. It follows that since the conductors wires are not broken, there is no need to follow any strict wiring sequence or code. The wires may be connected to the IDC members at will and any chance of making mistakes in the wiring connections is thus avoided. In the assembled condition, as shown in FIG. 7, each of the insulated conductor wires extends from end-to-end of its channel with the strain relief elements 54 closed around the insulation at each side of the insulation displacement connector member 42 so as to hold the conductor firmly in position. In this position, as shown by FIG. 7, each insulated conductor wire extends at one end of the housing over its ground line 70 which is disposed in the base of the channel. With this relationship between the ground lines and the insulated conductor wires and with the ground lines terminating in ground bar 72 on one end surface 30 of the housing, a compact construction for the device results and this need be no larger than one of the connectors used in the prior art filtering arrangements. Also as shown by FIG. 8, with the covers 78 disposed in position to cover the channels, the strain relief elements, the IDC member and the chip capacitor 68 are protected from outside damage.

Figure 9:
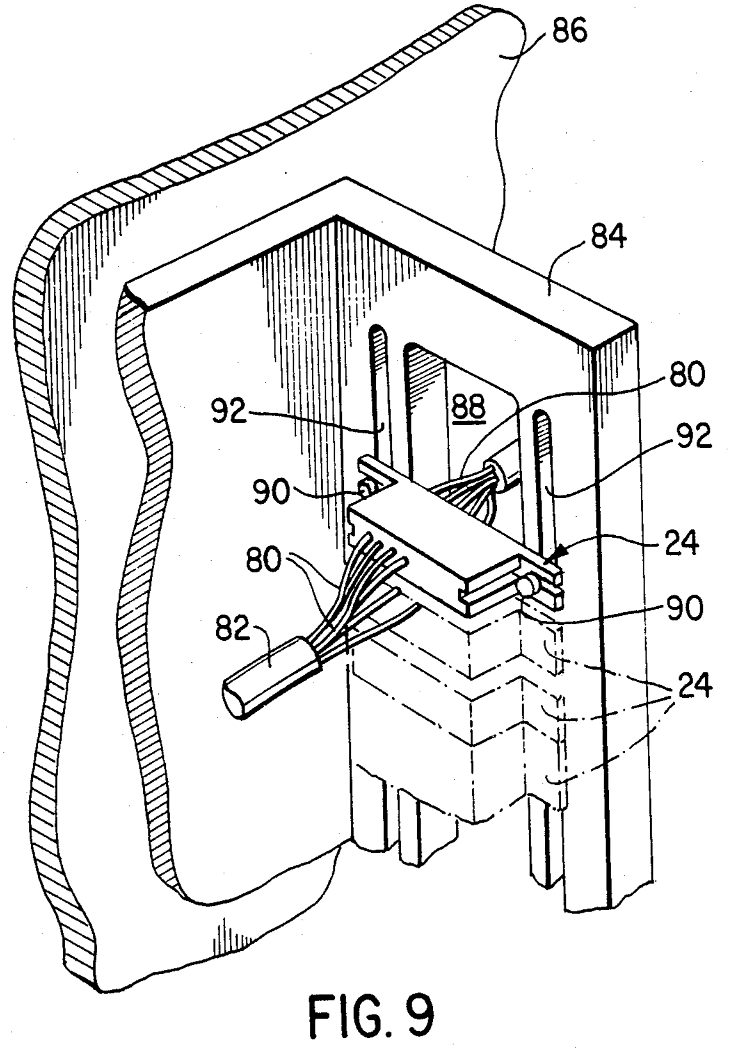
FIG. 9 is an isometric view of part of a grounding bulkhead of a central office equipment, the bulkhead carrying a plurality of the assemblies shown in FIG. 7.

The in-line filtering device of the invention and as particularly shown by the compact construction of the embodiment, is of simple design and is cheap and easy to manufacture. In addition to this, the insulated conductors may be added to the device to form the completed assembly by known factory assembly methods. It follows that the only manual operation required is the simple connection of the finished assembly of conductors and device to a bulkhead or other grounding support when placed in service. As shown by FIG. 9, in a typical in use situation, a bulkhead 84 is mounted on the rear face of an item 86 of central office equipment and this bulkhead is provided with a longitudinally extending aperture 88 for passage of the insulated conductor wires. A plurality of the devices 24 and their conductors 80 may be mounted easily upon the bulkhead by simply passing the conductors at one side of each of the devices 24 through the aperture 88 and then mounting the device 24 onto the bulkhead by passage of securing bolts 90 through the slotted lugs 32 and through narrow slots 92. As will be appreciated, this is a relatively quick and simple operation for placing the device in service as compared to previously known devices. The cost of making the inventive device, assembling the insulated conductor wires to it and placing the assembly into an operational position is insignificant compared with the cost for conventional devices.

Figure 4:
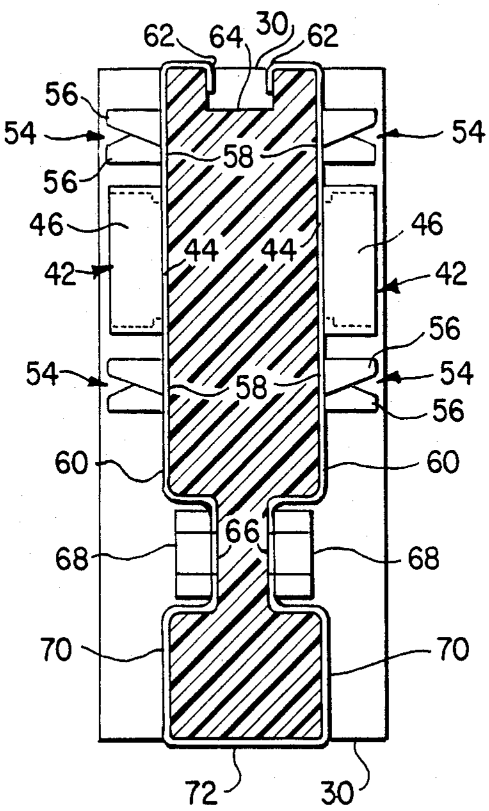
FIG. 4 is a cross-sectional view taken along line IV—IV in FIG. 3 and on a larger scale.
Figure 5:
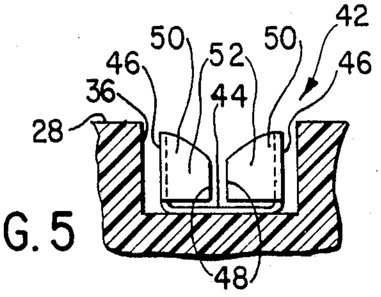
FIG. 5 is a cross-sectional view taken along line V—V in FIG. 3 and on a larger scale.
Figure 7:
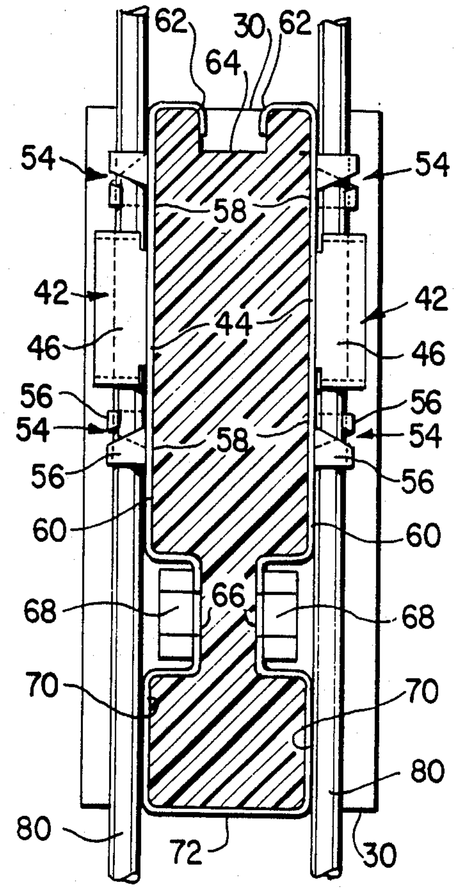
FIG. 7 is a view similar to FIG. 4 and showing an assembly of the filtering device and insulated conductor wires of a telecommunications line.

In a modification of the embodiment (not shown) to avoid the need to bend the extension 60 and the ground line 70 to pass into recess 66, the ends of the extension and ground lines remain planar and are electrically connected to the side of the chip capacitor 68 remote from that shown for the connection in FIGS. 4 and 7. Thus the ends of the extension 60 and ground lines 70 lie at the top of or above the recess 66 with the capacitor 68 seated firmly in contact with the bottom of the recess.

What is claimed is:

1. An in-line filtering device for a telecommunications line comprising a housing of dielectric material, the housing defining a channel with an open side and two open ends for passage of an insulated conductor wire of the line along the channel and out through the open ends, the device also comprising an insulation displacement connector member for severing insulation and electrically contacting the conductor wire of the telecommunications line, the insulation displacement connector member disposed within the channel and oriented for acceptance of the conductor wire as the wire is inserted laterally through the open side and into the channel, a ground line, and a radio frequency filter connecting the connector member to the ground line.

2. A filtering device according to claim 1 provided with a strain relief means for gripping around the insulation of an insulated conductor.

3. A filtering device according to claim 2 wherein the strain relief means comprises two strain relief elements, one on each side of the insulation displacement connector member, to grip conductor insulation on a conductor wire as it extends in both directions from the insulation displacement connector member.

4. A filtering device according to claim 1 wherein a plurality of insulation displacement connector members are provided and are dielectrically insulated from one another by the housing, and each insulation displacement connector member has its individual ground line with the ground lines of the members joined to a common ground bar.

5. A filtering device according to claim 4 wherein each insulation displacement member has an extension and the filter is connected between the extension and the ground line.

6. A filtering device according to claim 5 wherein the common ground bar and the ground lines are integral and are provided by a single metal member with the ground lines projecting in an in-parallel relationship to one another from the common ground bar.

7. A filtering device according to claim 1 wherein the housing has two sides at least one of which is formed with channels having lateral openings to the surface of the side, the channels separated by ribs of the housing, and an insulation displacement connector member is held within each channel for lateral reception of an insulated conductor wire through the opening.

8. A filtering device according to claim 7 wherein each side is formed with channels separated by ribs with the channels in one side separated by a web from those on the other side.

9. A filtering device according to claim 8 wherein in each channel there is also included a strain relief means for gripping around the insulation of an insulated conductor.

10. A filtering device according to claim 8 wherein a strain relief means is associated with each insulation displacement connector member, said strain relief means including two strain relief elements disposed within the associated channel, one element at each side of the associated insulation displacement connector member.

11. A filtering device according to claim 7 wherein each insulation displacement connector member has an individual ground line which extends along its channel from the member.

12. A filtering device according to claim 11 provided with a common ground bar with the ground lines extending from the ground bar and wherein each insulation displacement connector member has an extension, an associated filter is connected between the extension and associated ground line, and the extension, filter and ground line are disposed within the base of a corresponding channel.

13. A filtering device according to claim 12 wherein each side is formed with channels separated by ribs with the channels in one side separated by a web from those on the other side, the device provided with two covers mountable one on each side of the housing so as to close the lateral openings of the channels, and the ground bar is disposed at one end surface of the housing which extend between the sides.

14. A filtering device according to claim 13 wherein the channels are formed so as to extend from end-to-end of the housing and open at end surfaces of the housing whereby the covers, when mounted, leave the ends of the channels open for passage of insulated conductors.

15. A filtering device according to claim 12 wherein the common ground bar and the ground lines are integral and are provided by a single metal member with the ground lines projecting in an in-parallel relationship to one another from the commnn ground bar.

16. A filtering device according to claim 7 wherein in each channel there is also included a strain relief means for gripping around the insulation of an insulated conductor.

17. A filtering device according to claim 7 wherein a strain relief means is associated with each insulation displacement connector member, said strain relief means including two strain relief elements disposed within the associated channel, one element at each side of the associated insulation displacement connector member.

18. A filtering device according to claim 8 provided with two covers mountable one on each side of the housing so as to close the lateral openings to the channels.

19. An assembly of an insulated telecommunications conductor wire and an in-line filtering device for a telecommunications line comprising a housing of dielectric material, the housing defining a channel with two open ends for passage of the insulated conductor wire along the channel and out through the open ends, the device also comprising insulation displacement connector member for severing insulation and electrically contacting the conductor wire of the telecommunications line, the insulation displacement connector member disposed within the channel, a ground line, and a radio frequency filter connecting the connector member to the ground line, and the insulated conductor wire being held by the insulation displacement connector member with the member extending through the insulation and electrically contacting the conductor wire and with the conductor wire extending unbroken into the housing, through the insulation displacement connector member and out from the housing.

20. An assembly according to claim 19 wherein the insulated conductor wire is gripped in the housing by two strain relief elements disposed one on each side of the insulation displacement connector member.

21. An assembly according to claim 19 wherein the strain relief elements are disposed within the channel, the insulated conductor wire extending along the channel and through the strain relief elements and insulation displacement connector member.

22. An assembly according to claim 19 formed with a plurality of channels on at least one side of the housing, the channels separated by ribs of the housing, an insulation displacement connector member held within each channel, and a plurality of insulated conductor wires disposed within at least some of the channels, one conductor wire to each channel and electrically connected to an associated insulation displacement connector member.

23. An assembly according to claim 22 wherein each insulation displacement connector member has an individual ground line which extends along the base of its channel, an associated radio frequency filter is located in the base of the channel and each of the insulated conductor wires extends along its channel in a position outwardly from the ground line and the filter, a cover being provided for mounting upon said one side of the housing so as to cover the lateral openings of the channels.

24. An assembly according to claim 23 wherein the individual ground lines are joined to a common ground bar, said ground bar mounted at one end surface of the housing which extends between the sides.

* * * * *